Feb. 21, 1967 B. A. BABB 3,305,706

HIGH DENSITY PACKAGING FOR ELECTRONIC COMPONENTS

Filed June 11, 1964

3 Sheets-Sheet 1

INVENTOR.
BURTON A. BABB
BY [signature]
ATTORNEY

United States Patent Office 3,305,706

Patented Feb. 21, 1967

3,305,706
HIGH DENSITY PACKAGING FOR ELECTRONIC COMPONENTS

Burton Adams Babb, Hinsdale, Ill., assignor to International Telephone and Telegraph Corporation, New York, N.Y., a corporation of Maryland Filed June 11, 1964, Ser. No. 374,484
5 Claims. (Cl. 317—101)

This invention relates to the packaging of electronic components and more particularly to means for packaging components with an extremely high density per unit of volume.

Not too long ago, those who work in the electronics packaging arts viewed printed circuit boards as a means of increasing component density and thereby reducing the size and weight of an electronic device. By more recent standards, even printed boards are much too large for some applications. For example, excessive size and weight carry an extremely high premium when equipment must be transported by air or truck. Less spectacular, but just as important, size becomes very important when existing electronic systems must be expanded in an already crowded building.

Equal to, or perhaps more important than the size and weight considerations are the cost of manufacture considerations. In this connection, common practice requires much inter-card cabling to join the printed circuit cards into a completed system. An example of equipment constructed in this manner is found in the crosspoint networks of some electronic switching systems. The cabling in these networks necessitates much hand labor, wires, supporting structure and the like. Thus, both cost and space may be reduced if the inter-card cabling is eliminated.

Accordingly, an object of this invention is to improve the packaging of electronic components by increasing the density of such components and by reducing inter-card cabling to a minimum. In particular, an object is to reduce the size of crosspoint switching networks.

In accordance with one aspect of this invention, these and other objects are provided by a unitized component assembly preferably having a plurality of vertical and horizontal conductors spaced away from each other and arranged in a grid pattern. Then, a number of pellets or wafers containing suitable electronic components (such as PNPN diode crosspoint switches) are electrically connected between the horizontal and vertical conductors at the intersection of the grid pattern. The result is a single unitary package forming a switching matrix. Finally, a number of these unitary packages are supported in groups, with each group having its packages arranged in spaced parallel relation. The groups are oriented, with respect to each other, in a manner which completes the inter-matrix connections without requiring any inter-card cabling.

The above mentioned and other features of this invention and the manner of obtaining them will become more apparent, and the invention itself will be best understood by reference to the following description of an embodiment of the invention taken in conjunction with the accompanying drawings, in which.

Figure 1:
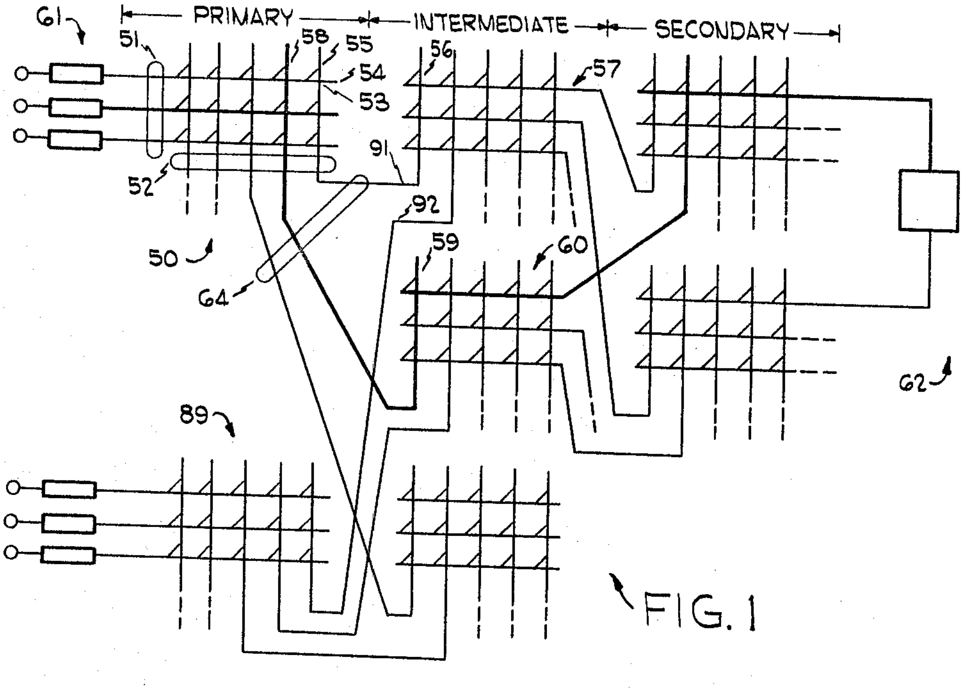
FIG. 1 is a schematic circuit diagram showing the layout of an exemplary electronic switching network.

The exemplary switching network of FIG. 1 is constructed from a number of cascaded switching stages, here designated "Primary," "Intermediate," and "Secondary." Each stage comprises one or more matrices, such as 50, made of horizontal 51 and vertical 52 conductors which intersect one another to form a number of switching crosspoints. For example, the crosspoint 53 is at the intersection of the horizontal multiple 54 and vertical multiple 55.

By inspection of the FIG. 1 network, it should be apparent that every vertical multiple in a primary stage matrix connects with a vertical multiple in a different intermediate stage matrix. For example, the vertical multiple 55 connects with a multiple 56 of a first intermediate matrix 57, and another primary vertical multiple 58 connects with a vertical multiple 59 in a second intermediate matrix 60. The horizontal multiples of the intermediate switching stage connect with the vertical multiples in the secondary stage in a similar manner. The object of this network is to close a selected crosspoint in each stage and thereby connect any one of a first kind of circuits 61 with any one of a second kind of circuits 62. One such connection is shown by heavily inked lines.

The network construction which should be noted at this time is that electrical connections from the five vertical multiples 52 in matrix 50 must be distributed over five vertical multiples in five different intermediate matrices. Heretofore, this distribution has been accomplished through the use of inter-card cables (such as 64) which must be put together by hand labor. That expensive hand construction, which consumes both space and weight, is eliminated by this invention.

Figure 2A:
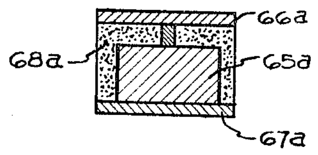
FIG. 2 shows three embodiments of devices each having a single electronic component (which may be a PNPN diode crosspoint switch) embedded in a pellet or wafer.
Figure 2B:
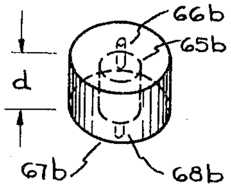
Figure 2C:
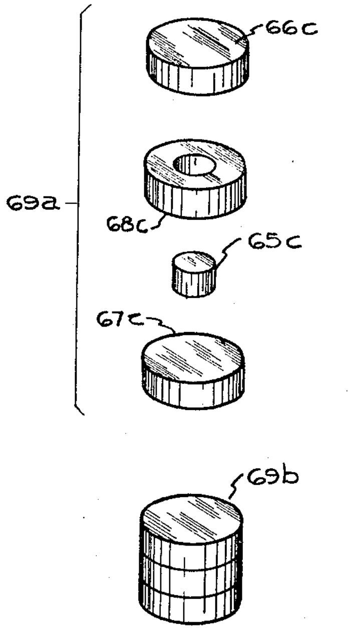

A modern packaging technique seals electronic components 65 (FIG. 2) in a pellet or wafer 66. In one exemplary construction, the component 65 is a PNPN diode. While many pellet construction techniques may be used, an exemplary three are shown in FIG. 2. Thus, in FIG. 2A, the diode **65*a* sets on a first conductor plate 67*a* and is soldered to a second conductor plate 66*a*. Any suitable potting compound fills space 68*a* and seals the diode away from its environment. In a second embodiment (FIG. 2B), the component is embedded in a ceramic pellet or wafer and its leads or electrodes are brought out flush with the upper and lower surface 66*b*, 67*b* of the wafer 68*b*. In the third exemplary construction, the diode 65*c* is pressed into a ceramic ring 68*c*. Then upper and lower conductor plates 66*c*, 67*c* are cemented in place by a conductive compound to form a laminated assembly 69 (an exploded view of which appears at 69*a* and an assembled view appears at 69*b*). This way, electrical connections are made with the component 65** by attaching wires or other electrical conductors to the top and bottom of the wafer.

Figure 3:
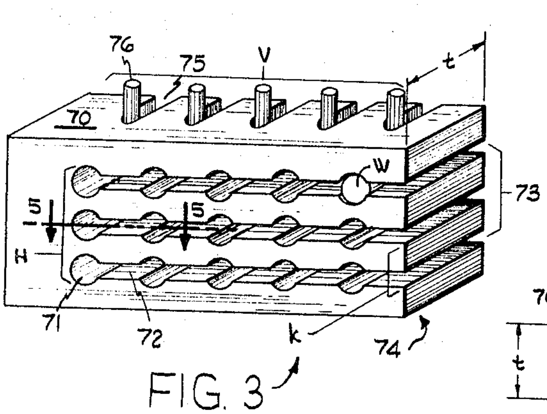
FIG. 3 is a perspective view of a first example of a unitary package of electronic devices such as might be used in the exemplary switching network of FIG. 1.
Figure 6:
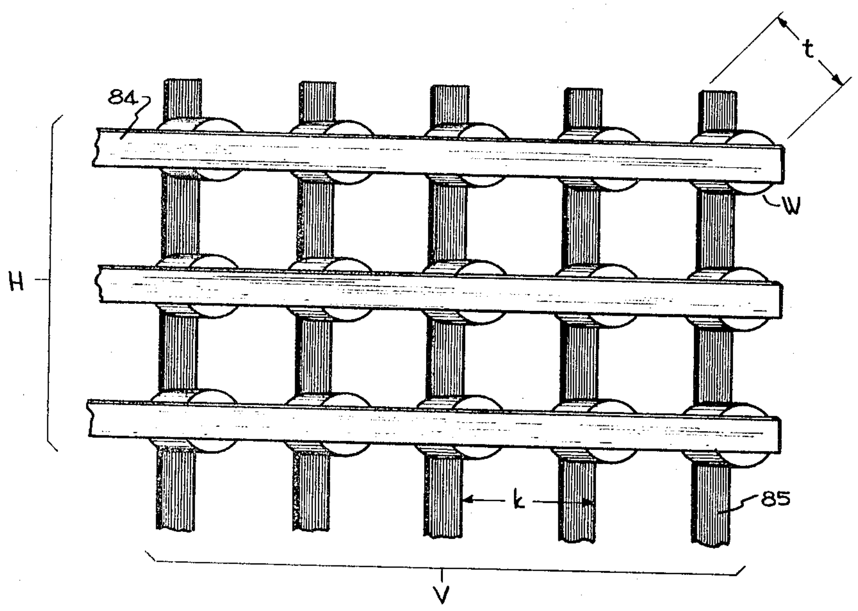
FIG. 6 shows another example of a unitary package such as might be used in the invention.

There are many known techniques for manufacturing unitized assemblies using devices such as the wafers or pellets of FIG. 2. Two exemplary construction techniques are shown by the assemblies of FIGS. 3 and 6; however, it should be understood that my invention is not limited to these particular techniques but is broad enough to cover any suitable assemblies. For convenience of expression, assemblies made by these and other similar techniques are herein generically called "unitary packages."

In each construction, there are vertical V and horizontal H conductors spaced away from each other and arranged in a grid pattern. These conductors may be the conductors 52, 51 of FIG. 1, for example. At each intersection of a vertical and a horizontal conductor, a wafer or pellet is electrically connected to form a crosspoint switch. For example, the wafer W may be the crosspoint switch 53 of FIG. 1.

The first example (FIGS. 3–5) of a unitary package will now be explained in detail. To assemble the wafers into a unified matrix package, a sheet of insulation material 70 (FIG. 3) is provided with a number of holes (such as 71) which may be conveniently distributed in a grid pattern. These holes are selectively interconnected by canals or depressions 72 formed in the insulating material. Thus, FIG. 3 shows that the holes are interconnected on one side of the material 70 to form a plurality of horizontal multiples. Three exemplary multiples 73 are shown in FIG. 3. At one end 74 of the material 70, the canals wrap around the insulating material to form three terminals for making clip-in connections with other equipments.

Figure 4:
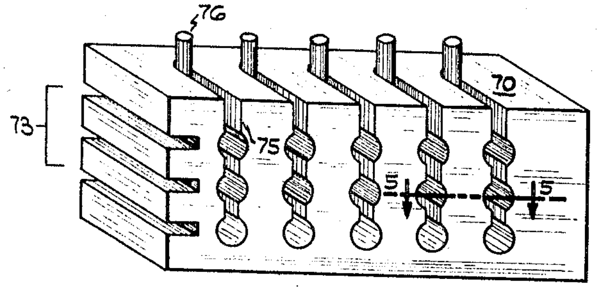
FIG. 4 is another perspective view which shows the reverse side of the package of FIG. 3.

Vertical multiples (such as 75) are formed by canals on the other side of the material 70. Five exemplary vertical multiples are shown in FIG. 4. These vertical canals wrap across the top of the sheet of insulation material 70 where each vertical canal terminates at a solder terminal (such as 76). These terminals are embedded in the plastic 70. This way wires may be joined to the terminals, as by solder or wire wrap.

Figure 5:
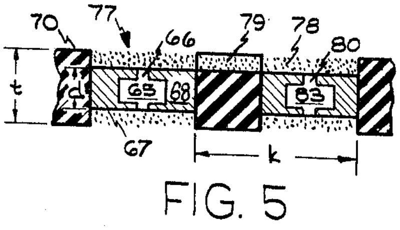
FIG. 5 is a cross sectional view of the package (taken along line 5—5 of FIGS. 3 and 4) showing how the wafer of FIG. 2 is mounted.

As best shown in FIG. 5, the insulating material 70 has a thickness *t* which is much greater than the thickness *d* of the wafer 68. This way, the wafer may be pressed into a hole in the insulating material 70 and still leave a well 77 for receiving cement. Thereafter, an electrically conductive cement (shown by stippling 78) is rubbed over the surface of the insulating material 70. The cement flows into the wells (as at 77) and canals (as at 79), thus cementing the wafer into position and electrically interconnecting the adjacent terminals 66, 80 of components 65, 83. Of course, excessive cement is cleaned from the surfaces of material 70 so that the conductive cement is restricted to the wells and canals.

If a component becomes defective, a tool which looks somewhat like a paper punch is used to push the wafer 68 out of the material 70. Then a new wafer 68 is pushed into position and more cement is rubbed over the surface.

The second example of a unitary package is shown in FIG. 6. It comprises a plurality of conductive strips (such as solder clad Phosphor bronze) arranged in vertical and horizontal orientation. One such strip 84 is shown in a horizontal position and another such strip 85 is shown in a vertical position. These may be the conductors 54, 55 of FIG. 1.

Regardless of the technique used to assemble the unitary package, the important feature is that the thickness *t* of the package should be less than the spacing *k* between the components. As will become more apparent, the physical dimensions of the final assembly will depend upon the maximum space of the length, height and thickness of the unitary package. Thus, the packages must be kept as thin as possible. If not, the assembly will begin to fan-out as its size is increased.

Figures 7, 8:
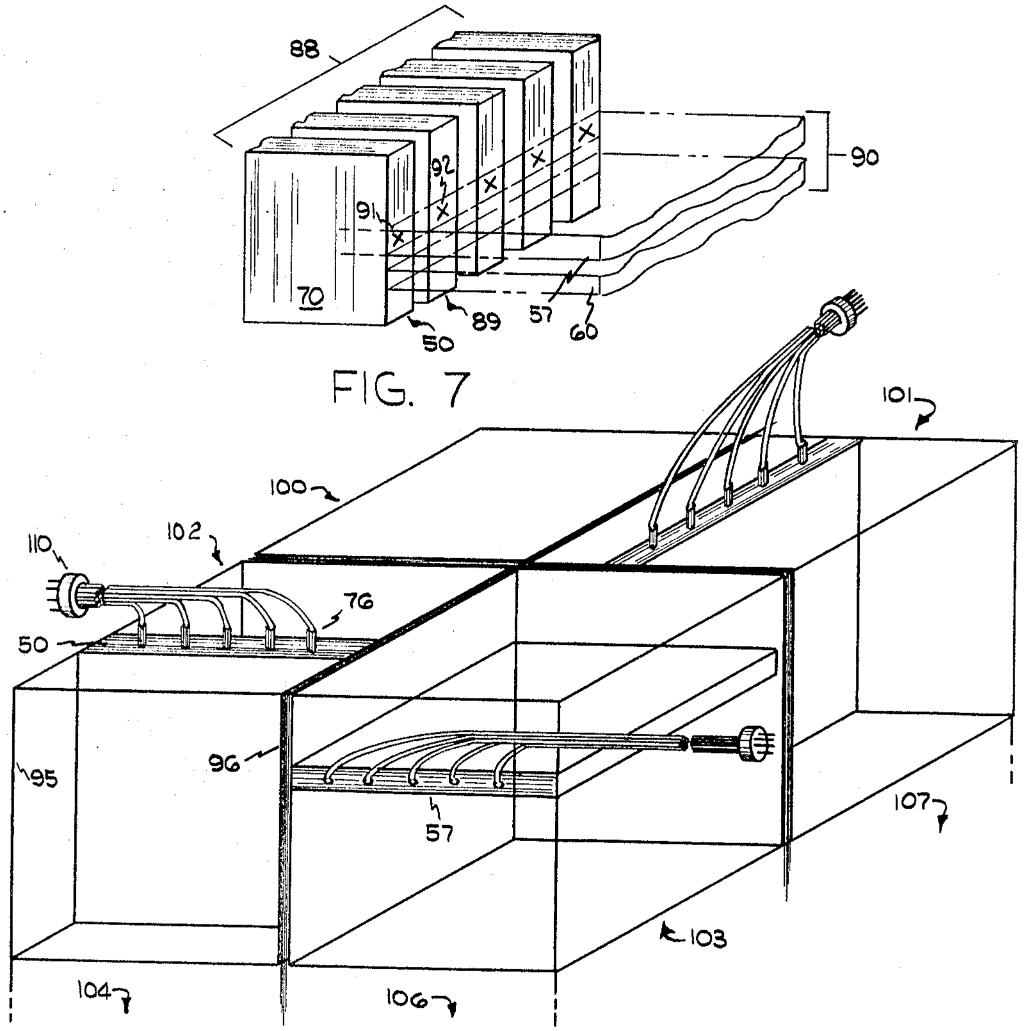
FIG. 7 is a perspective view of a fragment of an assembly of the FIGS. 3 and 4 packages, constructed in accordance with the invention.
FIG. 8 is a perspective view showing how the assembly of FIG. 7 is supported.

In keeping with the inventive concepts, a plurality of the packaged matrices are supported in groups with each group having its packages arranged in spaced parallel relations. To eliminate the need for inter-stage cabling, the groups are oriented with respect to each other, as shown in FIG. 7. Here an exemplary five 88 of the unitary matrix packages (such as 70) are supported in vertical, spaced parallel relation. One of these packages 50 may be thought of as the first primary matrix 50 of FIG. 1. The next package 89 may be thought of as the second primary stage matrix. In like manner, the remainder of the packages 88 represent other primary stage matrices which do not appear in FIG. 1.

The intermediate stage matrix packages 90 are positioned and supported at right angles to the primary stage matrix packages. For example, the intermediate stage matrix packages 57, 60 which appear in FIG. 7 may be thought of as the matrices with the same number in FIG. 1. Other intermediate stage packages do not appear in FIG. 7; however, it should be understood that any number of matrix packages may be provided.

By visual comparison, it should be apparent that the X-mark 91 (FIG. 7) corresponds to the inter-stage wire 91 of FIG. 1. In like manner, the X-mark 92 designates a second inter-stage wire 92 from a vertical in primary stage matrix 89 to a vertical in intermediate stage matrix 57. The remaining X-marks represent similar connections which are not shown in detail in FIG. 1. It should now be clear that simple plug-and-jack connectors located at the X-marks of FIG. 7 can replace the inter-stage cabling 64 of FIG. 1.

FIG. 8 shows an electronic assembly comprised of sub-assemblies having a high density of components. The assembly includes a miniature library rack for receiving and supporting the sub-assemblies, each of which may be a unitary matrix package, as described above. The thin lines (such as 95) represent the library rack which is made in any well known manner. The thick lines (such as 96) represent a jack field such as shown on page 143 of Catalog 700 copyright by Cambridge Thermionic Corporation 1963. When the sub-assembly matrix packages are pushed into position in the library rack, these jacks complete the connections designated by the X-marks in FIG. 7. Even though FIG. 8 shows only the two packages 50, 57, it should be understood that any number of packages may be provided and supported in a similar manner. The cubes 100–107 are intended to show that the library rack may be expanded to provide added capacity.

Preferably, each matrix package has wires connected, at one end, to the terminals (such as 76) and at the other end to a plug type connection 110. This way the matrix packages may be plugged into associated equipment and then slipped into position in the library rack.

Figure 9:
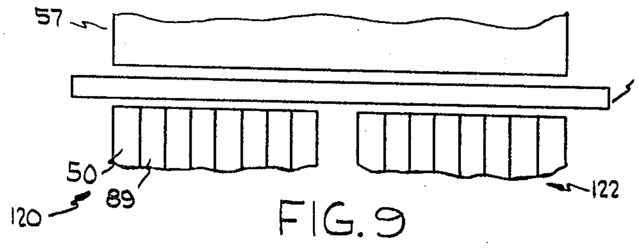
FIG. 9 shows embodiment which is an alternative to the FIG. 8 embodiment.

FIG. 9 shows an alternative way in which the entire network may be assembled. A primary network stage assembly 120 of matrix packages (such as 50, 89) plugs into jacks on a first side of a jack field 121. An intermediate network stage assembly of matrix packages (such as 57) plugs into the other side of the jack field 121. An assembly 122 of secondary switching stage matrix packages plugs into the first side of the jack field 121.

The many advantages of the assembly should be apparent to those skilled in the art. In one exemplary switching system, there was a 50-to-1 savings of space.

While the principles of the invention have been described above in connection with specific apparatus and applications, it is to be understood that this description is made only by way of example and not as a limitation on the scope of the invention.

I claim:

1. A high component density electronic assembly comprising a multi-cellular library rack having at least one jack field therein for separating at least two of said cells and a plurality of unitary packaged sub-assemblies of components, said sub-assemblies being supported in spaced parallel relation by said library rack, the sub-assemblies in one of said cells being oriented on one side of said jack field with respect to the sub-assemblies in another of said cells on the other side of said jack field to eliminate the need for inter-sub-assembly cabling by utilizing the jacks in said field to make all inter-sub-assembly electrical connections.

2. The assembly of claim 1 wherein said sub-assemblies in said one cell are positioned at right angles to the sub-assemblies in the other cell.

3. The assembly of claim 1 wherein some of said sub-assemblies plug into one side of said jack field and other of said sub-assemblies plug into the other side of said jack field, the sub-assemblies plugged into one side of said jack field being positioned at right angles to the sub-assemblies plugged into the other side of said jack field.

4. A high density packaged electronic network comprising a plurality of vertical and horizontal conductors spaced away from each other and arranged in a grid pattern, a plurality of electronic components electrically connected between the horizontal and vertical conductors at the intersections in said grid pattern, thereby providing a unitary package of electronic components, a multi-cellular library rack having at least one jack field therein for separating at least two of said cells, a plurality of said unitary packages supported by said library rack in spaced parallel relations, the packages in one of said cells on one side of said jack field being oriented with respect to the packages in another of said cells on the other side of said jack field to eliminate the need for inter-package cabling by utilizing the jacks in said field to make inter-package electrical connections.

5. The assembly of claim 1 wherein some of said sub-assemblies plug into each of two cells on one side of said jack field, said sub-assemblies in said two cells being parallel with each other, and other of said sub-assemblies plug into the other side of said jack field, the sub-assemblies plugged into said other side of said jack field being long enough to bridge said two cells for enabling them to make connection with said sub-assemblies plugged into the two cells on said one side of said jack field.

References Cited by the Examiner

UNITED STATES PATENTS

| | | | |
|---|---|---|---|
| 2,872,664 | 2/1959 | Minot | 317—101 X |
| 3,001,102 | 9/1961 | Stiefel et al. | 317—99 |
| 3,241,000 | 3/1966 | Roslyn | 317—101 |

FOREIGN PATENTS

| | | |
|---|---|---|
| 750,244 | 6/1956 | France. |

ROBERT K. SCHAEFER, *Primary Examiner.*

W. C. GARVERT, *Assistant Examiner.*